United States Patent
Park

(10) Patent No.: US 7,795,962 B2
(45) Date of Patent: Sep. 14, 2010

(54) METHOD AND APPARATUS TO CORRECT AN ERROR IN A SWITCHING POWER AMPLIFIER

(75) Inventor: Hae-kwang Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 361 days.

(21) Appl. No.: 11/648,623

(22) Filed: Jan. 3, 2007

(65) Prior Publication Data

US 2008/0024210 A1    Jan. 31, 2008

(30) Foreign Application Priority Data

Jul. 28, 2006    (KR)    .................. 10-2006-0071577

(51) Int. Cl.
*H03F 3/38* (2006.01)

(52) U.S. Cl. ........................................ 330/10

(58) Field of Classification Search ............ 330/10, 330/207 P, 251

See application file for complete search history.

(56) References Cited

U.S. PATENT DOCUMENTS 3,879,663 A * 4/1975 McGrogan, Jr. ............ 375/248

6,504,427 B2 * 1/2003 Midya et al. ................. 330/10
6,768,779 B1    7/2004 Nielsen
6,922,100 B2    7/2005 Midya et al.
6,963,189 B2   11/2005 Nielsen et al.

FOREIGN PATENT DOCUMENTS

KR    2003-66847    8/2003

* cited by examiner

*Primary Examiner*—Robert Pascal
*Assistant Examiner*—Khiem D Nguyen
(74) *Attorney, Agent, or Firm*—Stanzione & Kim, LLP

(57) ABSTRACT

An error correction method and apparatus to enhance performance of a switching power amplifier through digital feedback of an audio pulse width modulation (PWM) signal. The error correction apparatus includes a PWM unit to convert an audio signal into a PWM signal, a power stage unit to switch and amplify power of the PWM signal generated by the PWM unit, an error signal extraction unit to compare a reference PWM signal generated in the PWM unit with the PWM signal output from the power stage unit, thereby extracting an error signal, a remodulation unit to compare the error signal extracted in the error signal extraction unit with a reference signal having a predetermined slope, thereby modulating the error signal to an error PWM signal, and a signal correction unit to correct an error, by changing the pulse width of the PWM unit according to the error PWM signal generated in the remodulation unit.

12 Claims, 4 Drawing Sheets

METHOD AND APPARATUS TO CORRECT AN ERROR IN A SWITCHING POWER AMPLIFIER

CROSS-REFERENCE TO RELATED APPLICATIONS

This application claims priority under 35 U.S.C. 119 §(a) from of Korean Patent Application No. 10-2006-0071577, filed on Jul. 28, 2006, in the Korean Intellectual Property Office, the disclosure of which is incorporated herein in its entirety by reference.

BACKGROUND OF THE INVENTION

1. Field of the Invention

The present general inventive concept relates to a switching power amplifier system, and more particularly, to an error correction method and apparatus to enhance the performance of a switching power amplifier by using a digital feedback technology of an audio pulse width modulation signal.

2. Description of the Related Art

A conventional switching power amplifier for audio signals may be classified as class A, class B, class AB and class D. The class D amplifier can reduce amplification efficiency drops occurring in class A, class B, and class AB amplifiers. The class D amplifier uses a method in which an audio signal is converted into a pulse width modulation (PWM) signal and switched. Accordingly, the class D amplifier does not experience a data conversion loss, and if a nonlinear component that occurs in an analog part of a switching circuit is overcome, a 100% amplification efficiency can be achieved. A conventional audio system using the above-mentioned class D amplifier includes a microcomputer to control the entire system, a digital signal processor to process a digital signal, a PWM unit to generate a PWM signal by comparing an audio signal and a carrier signal, and a switching power stage to amplify the voltage and current of the PWM signal.

However, the conventional class D power amplifier has a problem in that the nonlinearity of a power stage and ripple noise of a power supply unit deteriorate the audio performance of a system.

Accordingly, in order to solve the above-mentioned problem, a technology related to the conventional switching power amplifier has been disclosed in U.S. Pat. No. 6,768,779 B1 (PCT/DK98/00133) filed on Apr. 1, 1998, entitled "Pulse referenced control method for enhanced power amplification of a pulse modulated signal".

Referring to FIG. 1, in the technology related to the conventional switching power amplifier, an error processing unit 110 compares an input reference signal (Vr) with an output signal (V0) from a switching power stage 120 and generates an error signal (Ve).

A correction unit 130 generates a correction signal (Vc) by using the error signal (Ve) generated in the error processing unit 110.

However, in the conventional switching power amplifier, an accurate analog loop filter should be separately designed in order to generate the error signal (Ve) in the error processing unit 110, and thus, complexity and cost of a system increase.

Also, in the conventional switching power amplifier, a correction operation should be performed in an analog domain, but it is very difficult to correct the characteristic of external noise or a nonlinear characteristic due to characteristics of an analog signal.

SUMMARY OF THE INVENTION

The present general inventive concept provides an error correction apparatus to extract an error signal between an ideal pulse width modulation (PWM) signal output from a PWM unit of a switching power amplifier and a PWM signal output from a switching power stage, and to remodulate the error signal, thereby correcting the PWM error signal in a digital domain.

The present general inventive concept also provides an error correction method of enhancing performance of a switching power amplifier through a digital feedback of an audio PWM signal according to an error remodulation method.

The present general inventive concept also provides a switching power system to correct an error of the PWM signal.

Additional aspects and utilities of the present general inventive concept will be set forth in part in the description which follows and, in part, will be obvious from the description, or may be learned by practice of the general inventive concept.

The foregoing and/or other aspects and utilities of the present general inventive concept are achieved by providing an error correction apparatus of a switching power amplifier, the apparatus including a pulse width modulation (PWM) unit to convert an audio signal into a PWM signal, a power stage unit to switch and amplify the power of the PWM signal generated by the PWM unit, an error signal extraction unit to compare a reference PWM signal generated in the PWM unit with the PWM signal output from the power stage unit, thereby extracting an error signal, a remodulation unit to compare the error signal extracted in the error signal extraction unit with a reference signal having a predetermined slope, and to generate a remodulated error PWM signal, and a signal correction unit to correct an error by changing the pulse width of the PWM unit according to the error PWM signal generated in the remodulation unit.

The foregoing and/or other aspects and utilities of the present general inventive concept may also be achieved by providing an error correction method of a switching power amplifier, the method including converting an audio signal into a PWM signal, switching-amplifying the power of the generated PWM signal, comparing the reference PWM signal with the switching-amplified PWM, thereby extracting an error signal, comparing the extracted error signal with a reference signal having a predetermined slope and generating a remodulated error PWM signal, and correcting an error, by changing the pulse width of the PWM signal according to the error PWM signal.

The foregoing and/or other aspects and utilities of the present general inventive concept may also be achieved by providing an error correction apparatus of a switching power amplifier, the apparatus including an error signal extraction unit to compare a PWM signal with another PWM signal corresponding to the PWM signal to extract an error signal, a comparator to compare the extracted error signal with a clock signal having a predetermined shape to generate a PWM error signal, and a signal correction unit to generate an absolute correction quantity from the PWM error signal and to correct an error by changing a pulse width of the PWM signal using the absolute correction quantity.

A pulse width of the PWM error signal may increase when the magnitude of the extracted error signal increases.

The another PWM signal may be an amplified version of the PWM signal.

The error signal extraction unit may further include a gain adjustment unit to adjust a gain of the PWM signal, another gain adjustment unit to adjust a gain of the another PWM signal, a differential signal detection unit to detect a differential signal between the PWM signal output from the gain adjustment unit and the another PWM signal output from the another gain adjustment unit, and an integration unit to integrate the differential signal to generate the extracted error signal.

The foregoing and/or other aspects and utilities of the present general inventive concept may also be achieved by providing an error correction method of a switching power amplifier, the method including comparing a PWM signal with another PWM signal corresponding to the PWM signal to extract an error signal, comparing the extracted error signal with a clock signal having a predetermined cycle to generate a PWM error signal, generating an absolute correction quantity from the PWM error signal, and correcting an error by changing a pulse width of the PWM signal using the absolute correction quantity.

The foregoing and/or other aspects and utilities of the present general inventive concept may also be achieved by providing a computer readable recording medium having embodied thereon a computer program to execute a method, wherein the method includes an error correction method of a switching power amplifier, the method including comparing a PWM signal with another PWM signal corresponding to the PWM signal to extract an error signal, comparing the extracted error signal with a clock signal having a predetermined cycle to generate a PWM error signal, generating an absolute correction quantity from the PWM error signal, and correcting an error by changing a pulse width of the PWM signal using the absolute correction quantity.

The foregoing and/or other aspects and utilities of the present general inventive concept may also be achieved by providing an error correction method of a switching power amplifier, including comparing a PWM signal version of an audio signal with a switch-amplified version of the PWM signal, and correcting an error in the switch-amplified version of the PWM signal by changing a pulse width of the PWM signal using the comparison result.

BRIEF DESCRIPTION OF THE DRAWINGS

These and/or other aspects and utilities of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
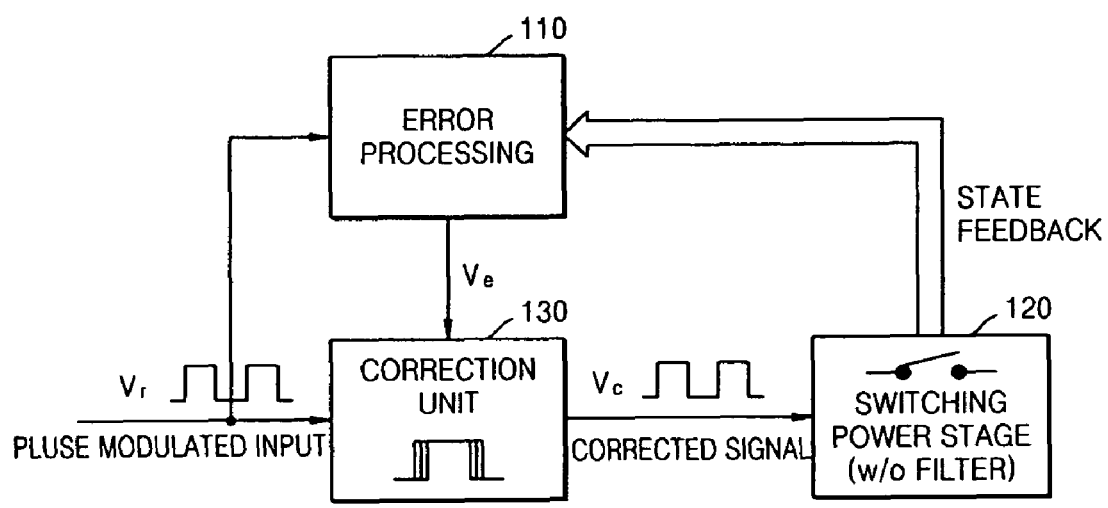
FIG. 1 is a diagram illustrating an error correction apparatus of a conventional switching power amplifier.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

Figure 2:
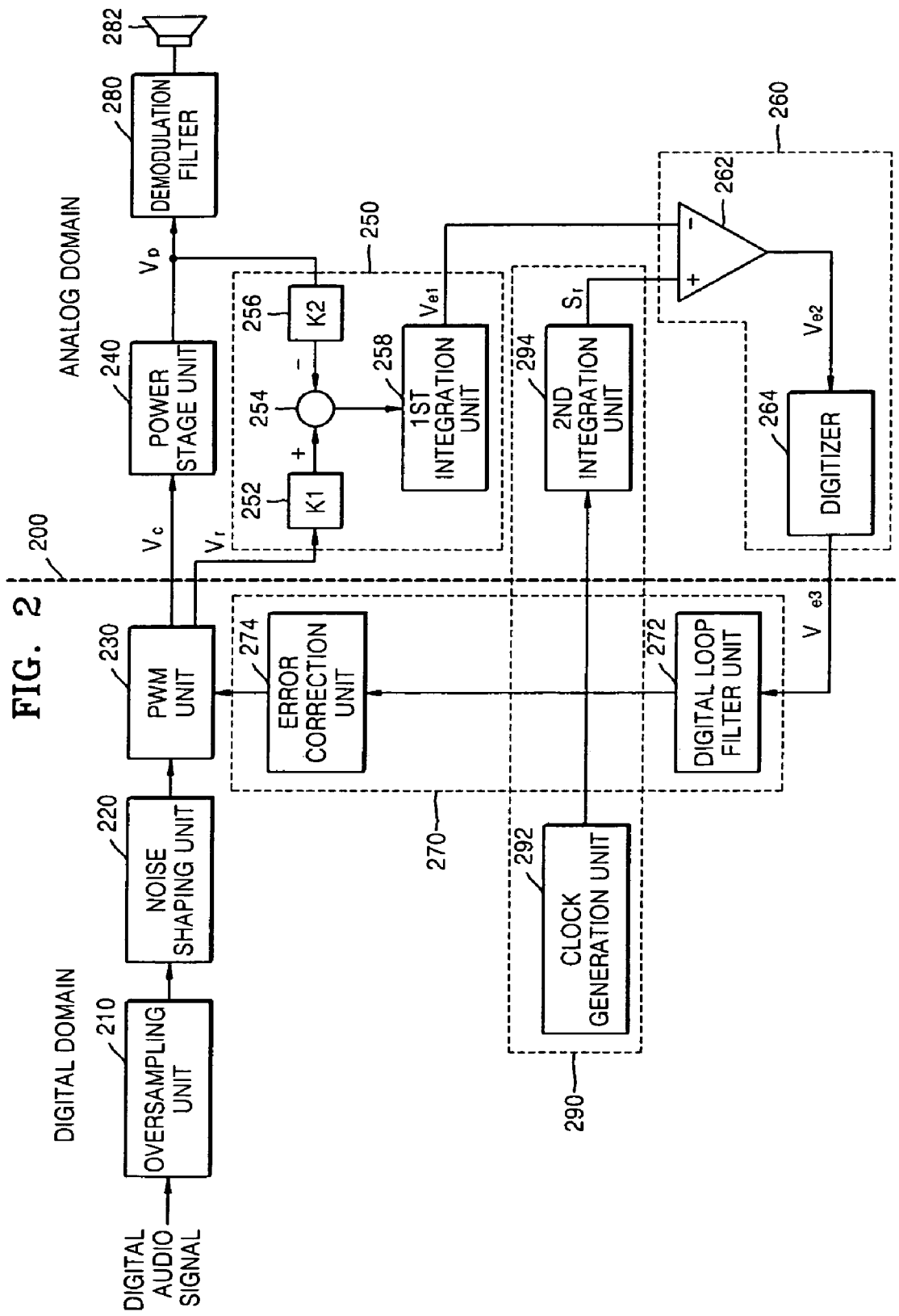
FIG. 2 is a block diagram illustrating an error correction apparatus of a switching power amplifier, according to an embodiment of the present general inventive concept.

FIG. 2 is a block diagram illustrating an error correction apparatus of a switching power amplifier according to an embodiment of the present general inventive concept.

In the error correction apparatus of the switching power amplifier illustrated in FIG. 2, a dotted line 200 divides FIG. 2 into a left block and a right block. The left block is a portion of the error correction apparatus of the switching power amplifier that operates in a digital domain, while the right block is a portion of the error correction apparatus of the switching power amplifier that operates in an analog domain.

Referring to FIG. 2, the error correction apparatus of the switching power amplifier includes an oversampling unit 210, a noise shaping unit 220, a pulse width modulation (PWM) unit 230, a signal correction unit 270, and a reference signal generation unit 290 in the digital domain, and includes a power stage unit 240, an error signal extraction unit 250, a remodulation unit 260, and a demodulation filter unit 280 in the analog domain.

The PWM unit 230 can convert a pulse code modulation (PCM) audio signal into a PWM signal.

Also, the power stage unit 240 switch-amplifies the power of a PWM signal generated by the PWM unit 230. The error signal extraction unit 250 includes first and second gain adjustment units 252 and 256, a differential signal detection unit 254, and a first integration unit 258. The error signal extraction unit 250 compares a reference PWM signal generated in the PWM unit 230 with an output PWM signal from the power stage unit 240, and extracts an error signal. The reference signal generation unit 290 includes a clock generation unit 292 and a second integration unit 294, and generates a reference signal that has a predetermined slope.

The remodulation unit 260 includes a comparison unit 262 and a digitizer 264. The remodulation unit 260 compares the error signal extracted in the error signal extraction unit 250 with the reference signal generated in the reference signal generation unit 290, and generates a remodulated digital error PWM signal.

The signal correction unit 270 includes a digital loop filter unit 272 and an error correction unit 274. The signal correction unit 270 changes the pulse width of the PWM unit 230 according to the error PWM signal generated in the remodulation unit 260, thereby correcting an error.

The error correction apparatus of the switching power amplifier will now be explained in more detail with reference to FIG. 2.

The oversampling unit 210 increases a sampling frequency to change an input PCM digital audio signal to a nonlinear distortion-less PWM signal.

The noise shaping unit 220 moves the noise component of the PCM digital audio signal output from the oversampling unit 210 to a frequency that is higher than is audible by humans.

The PWM unit 230 converts the PCM digital audio signal output from the noise shaping unit 220 to an analog PWM signal by using a reference carrier signal, adjusts the pulse width of the PWM signal according to an error correction signal generated in the error correction unit 274, and outputs the corrected PWM signal. The PWM unit 230 separates the corrected PWM signal (Vc) from the reference PWM signal (Vr) and outputs the signals.

The power stage unit 240 power-amplifies the analog PWM signal converted in the PWM unit 230, through a switching circuit.

The first and second gain adjustment units 252 and 256 multiply a gain of the reference PWM signal (Vr) output from the PWM unit 230 and a gain of the PWM signal (Vp) output from the power stage unit 240 by gain values (K1, K2), respectively, so that the gains can be adjusted to result in the PWM signal (Vr) and the PWM signal (Vp) having the same gain values. That is, the first gain adjustment unit 252 adjusts the gain of the reference PWM signal (Vr) output from the PWM unit 230. The second gain adjustment unit 256 adjusts the gain of the PWM signal (Vp) output from the power stage unit 240.

The differential signal detection unit 254 detects a differential signal between the PWM signal output from the first gain adjustment unit 252 and the PWM signal output from the second gain adjustment unit 256.

The first integration unit 258 integrates the differential signal that is detected in the differential signal detection unit 254, and extracts the result as an accumulated error signal (Ve1).

The clock generation unit 292 generates a clock signal for remodulation. The second integration unit 294 integrates the clock signal that is generated in the clock generation unit 292 and generates the result as a reference signal (Sr) in a sawtooth waveform.

The comparison unit (e.g. a comparator) 262 compares the error signal output from the first integration unit 258 with the sawtooth signal that is generated in the second integration unit 294, and extracts an error PWM signal (Ve2).

The digitizer 264 converts the error PWM signal (Ve2) output from the comparison unit 262 into a digital error PWM signal (Ve3) that is made to be discrete according to the system clock.

The digital loop filter unit 272 is a digital low pass filter that generates an absolute correction quantity from the digital error PWM signal that is digitized in the digitizer 264.

The error correction unit 274 generates an error correction signal used to adjust the pulse width of the PWM unit 230, by using the absolute correction quantity that is generated from the digital loop filter unit 272.

The demodulation filter unit 280 low-pass filters the analog PWM signal power-amplified in the power stage unit 280, thereby extracting the original audio signal.

Speakers 282 reproduce the audio signal extracted in the demodulation filter unit 280.

Figure 3A:
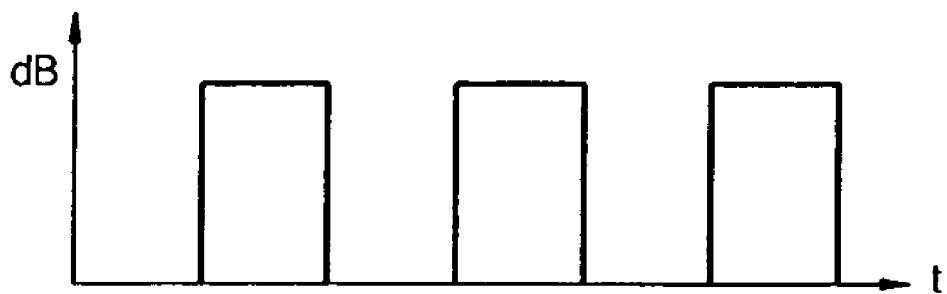
FIGS. 3A through 3C are diagrams illustrating waveforms in which the pulse width of an error pulse width modulation (PWM) signal is changed in a comparator illustrated in FIG. 2 with respect to the magnitude of an error signal (Ve1), according to an embodiment of the present general inventive concept.
Figure 3B:
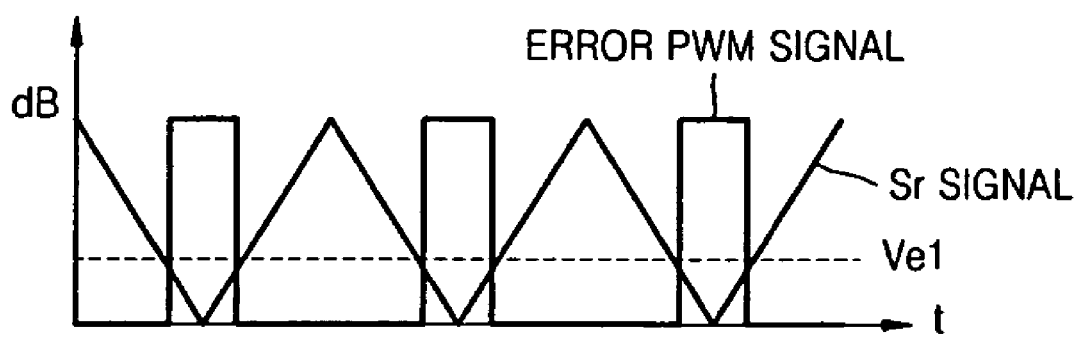
Figure 3C:
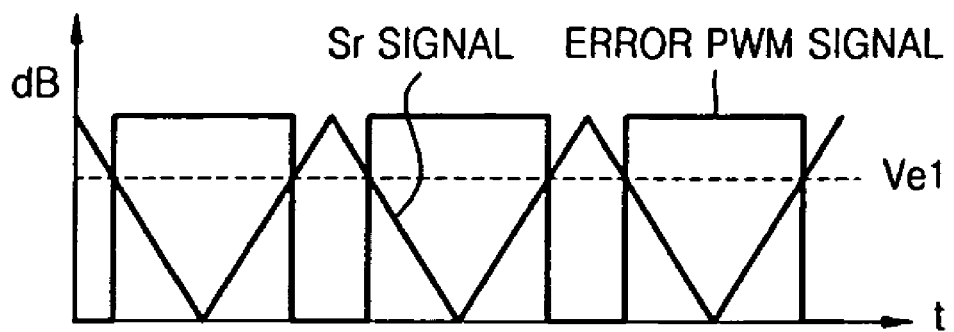

FIGS. 3A through 3C are diagrams illustrating waveforms in which the pulse width of an error PWM signal is changed in the comparator 262 illustrated in FIG. 2 with respect to the magnitude of an error signal (Ve1) according to an embodiment of the present general inventive concept.

FIG. 3A illustrates a clock signal generated in the clock generation unit 292. This clock signal can be converted into a sawtooth signal by using an integrator. The cycle of the clock signal has a value equal to a target cycle of an error PWM signal and bigger than the cycle of the sawtooth wave.

FIGS. 3B and 3C are waveform diagrams in which the error signal (Ve1) is compared with the sawtooth signal (Sr) and an error PWM signal is generated from the comparison. With respect to the magnitude of the error signal (Ve1), the pulse width of the error PWM signal changes. If the magnitude of the error signal (Ve1) increases, the pulse width of the error PWM signal becomes wider.

Figure 4:
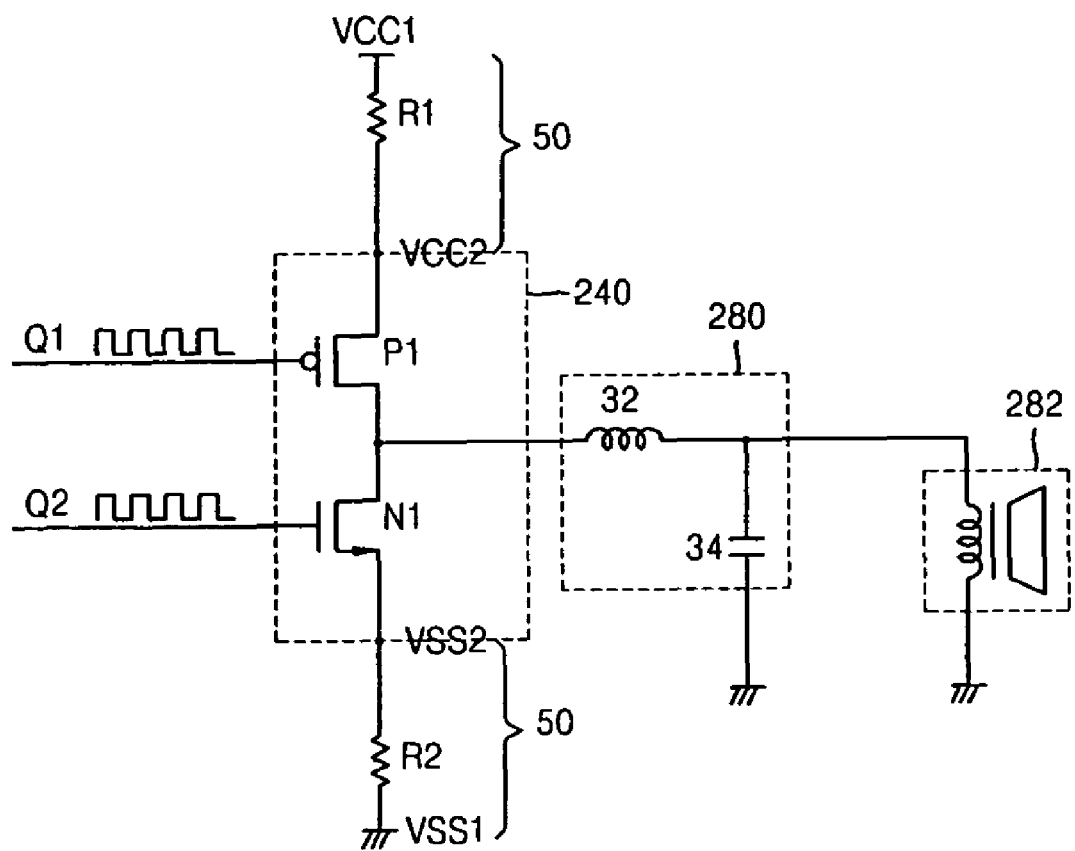
FIG. 4 is a circuit diagram illustrating the power stage unit and the demodulation filter unit illustrated in FIG. 2, according to an embodiment of the present general inventive concept.

FIG. 4 is a circuit diagram of the power stage unit 240 and the demodulation filter unit 280 illustrated in FIG. 2 according to an embodiment of the present general inventive concept.

The power stage unit 240 can include a PMOS transistor (P1) and an NMOS transistor (N1). A PWM signal is divided into a first PWM signal (Q1) and a second PWM signal (Q2) that have identical phases. The PMOS transistor (P1) is switched according to the first PWM signal (Q1) and an actual source voltage (Vcc2) is applied to the source. Also, the NMOS transistor (N1) is switched according to the second PWM signal (Q2) and the drain of the NMOS transistor (N1) is connected to the drain of the PMOS transistor (P1), and the source of the NMOS transistor (N1) is connected to the ground voltage (Vss2). Here, Vcc1 and Vss1 are ideal voltages applied from the voltage sources. Vcc2 and Vss2 are voltages dropped by predetermined levels by resistances (R1, R2) in the conductor 50 connecting the voltage sources and the power stage unit 240, and the actual voltages applied to the power stage unit 240. R1 and R2 are resistances occurring in the conductor 50 connecting the voltage source and the power stage unit 240. In another embodiment, the power stage unit 240 may be formed as an NN (NMOS/NMOS) type in addition to the PN (PMOS/NMOS) type.

The demodulation filter unit 280 can include an inductor 32 and a capacitor 34, and can remove the high frequency component of the output signal of the power stage unit 240.

According to the present general inventive concept as described above, by using a remodulated error PWM signal, a correction operation is performed in the digital domain, and thus power supply noise or the nonlinear characteristic can be removed, thereby enhancing performance of the switching power amplifier.

The present general inventive concept can also be embodied as computer readable codes on a computer readable medium. The computer-readable medium can include a computer-readable recording medium and a computer-readable transmission medium. The computer readable recording medium is any data storage device that can store data which can be thereafter read by a computer system. Examples of the computer readable recording medium include read-only memory (ROM), random-access memory (RAM), CD-ROMs, magnetic tapes, floppy disks, and optical data storage devices. The computer readable recording medium can also be distributed over network coupled computer systems so that the computer readable code is stored and executed in a distributed fashion. The computer-readable transmission medium can transmit carrier waves and signals (e.g., wire or wireless data transmission through the internet.)

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. An error correction apparatus of a switching power amplifier, the apparatus comprising:
   a pulse width modulation (PWM) unit to convert an audio signal into a PWM signal;
   a power stage unit to switch and amplify power of the PWM signal generated by the PWM unit;

an error signal extraction unit to compare a reference PWM signal generated in the PWM unit with the PWM signal output from the power stage unit, thereby extracting an error signal;

a remodulation unit to compare the error signal extracted in the error signal extraction unit with a reference signal having a predetermined slope, and to generate a remodulated error PWM signal;

a signal correction unit to correct an error by adjusting a pulse width of the PWM signal according to the error PWM signal generated in the remodulation unit;

a comparison unit to compare the error signal extracted in the error signal extraction unit with the reference signal having the predetermined slope and to extract an error PWM signal; and a digitizer to convert the error PWM signal output from the comparison unit into a digital error PWM signal according to a system clock.

2. The apparatus of claim 1, wherein the error signal extraction unit comprises:

a gain adjustment unit to individually adjust a gain of the reference PWM signal generated in the PWM unit and a gain of the PWM signal output from the power stage unit;

a differential signal detection unit to extract the differential signal between the reference PWM signal generated in the PWM unit and gain-adjusted in the gain adjustment unit with the PWM signal output from the power stage unit and gain-adjusted in the gain adjustment unit; and an integration unit to accumulate the differential signal extracted in the differential signal detection unit.

3. The apparatus of claim 1, further comprising:

a reference signal generation unit to generate the reference signal having the predetermined slope by integrating a clock signal.

4. The apparatus of claim 3, wherein the reference signal generation unit comprises:

a clock generation unit to generate the clock signal with a predetermined cycle; and an integration unit to integrate the clock signal with the predetermined cycle generated in the clock generation unit to generate a sawtooth wave.

5. The apparatus of claim 1, wherein the signal correction unit comprises:

a digital loop filter unit to generate an absolute correction quantity from the digital error PWM signal; and an error correction unit to generate an error correction control signal to adjust the pulse width of the PWM unit, by using the absolute correction quantity generated from the digital loop filter unit.

6. An error correction method of a switching power amplifier, the method comprising:

converting an audio signal into a PWM signal;
switching-amplifying power of the PWM signal;
comparing a reference PWM signal with the switching-amplified PWM, thereby extracting an error signal;
comparing the extracted error signal with a reference signal having a predetermined slope, and generating a remodulated error PWM signal;
correcting an error by changing a pulse width of the PWM signal according to the error PWM signal; and
converting the remodulated error PWM signal into a digital error PWM signal according to a system clock.

7. An error correction apparatus of a switching power amplifier, the apparatus comprising:

an error signal extraction unit to compare a PWM signal with another PWM signal corresponding to the PWM signal to extract an error signal;

a comparator to compare the extracted error signal with a clock signal having a predetermined shape to generate a PWM error signal;

a signal correction unit to generate an absolute correction quantity from the PWM error signal and to correct an error by changing a pulse width of the PWM signal using the absolute correction quantity; and a digitizer to convert the error PWM signal output from the comparison unit into a digital error PWM signal according to a system clock.

8. The error correction apparatus of claim 7, wherein a pulse width of the PWM error signal increases when the magnitude of the extracted error signal increases.

9. The error correction apparatus of claim 7, wherein the another PWM signal is an amplified version of the PWM signal.

10. The error correction apparatus of claim 7, wherein the error signal extraction unit further comprises:

a gain adjustment unit to adjust a gain of the PWM signal;
another gain adjustment unit to adjust a gain of the another PWM signal;
a differential signal detection unit to detect a differential signal between the PWM signal output from the gain adjustment unit and the another PWM signal output from the another gain adjustment unit; and
an integration unit to integrate the differential signal to generate the extracted error signal.

11. An error correction method of a switching power amplifier, the method comprising:

comparing a PWM signal with another PWM signal corresponding to the PWM signal to extract an error signal;
comparing the extracted error signal with a clock signal having a predetermined cycle to generate a PWM error signal;
generating an absolute correction quantity from the PWM error signal;
correcting an error by changing a pulse width of the PWM signal using the absolute correction quantity; and
converting the PWM error signal into a digital error PWM signal according to a system clock.

12. A non-transient computer readable recording medium having embodied thereon a computer program to execute a method, wherein the method comprises an error correction method of a switching power amplifier, the method comprising:

comparing a PWM signal with another PWM signal corresponding to the PWM signal to extract an error signal;
comparing the extracted error signal with a clock signal having a predetermined cycle to generate a PWM error signal;
generating an absolute correction quantity from the PWM error signal; and
correcting an error by changing a pulse width of the PWM signal using the absolute correction quantity; and
converting the PWM error signal into a digital error PWM signal according to a system clock.

* * * * *